United States Patent [19]
Bottomley et al.

[11] Patent Number: 5,201,311
[45] Date of Patent: Apr. 13, 1993

[54] SPATIALLY-LOCALIZED CHEMICAL-REACTION-RATE NMR SPECTROSCOPIC IMAGING

[75] Inventors: Paul A. Bottomley, Clifton Park; Christopher J. Hardy, Schenectady, both of N.Y.

[73] Assignee: General Electric Company, Schenectady, N.Y.

[21] Appl. No.: 927,780

[22] Filed: Aug. 10, 1992

Related U.S. Application Data

[63] Continuation of Ser. No. 727,334, Jul. 3, 1991, abandoned, which is a continuation of Ser. No. 392,316, Aug. 11, 1989, abandoned.

[51] Int. Cl.$^5$ .................................. A61B 5/055
[52] U.S. Cl. ........................... 128/653.2; 324/307; 324/309
[58] Field of Search .............. 128/653.2; 324/307, 324/309

[56] References Cited

U.S. PATENT DOCUMENTS

| | | | |
|---|---|---|---|
| 4,777,439 | 10/1988 | Granot | 324/309 |
| 4,794,337 | 12/1988 | Twieg | 324/309 |
| 4,878,021 | 10/1989 | Granot | 324/309 |
| 4,881,032 | 11/1989 | Bottomley et al. | 324/309 |
| 4,945,308 | 7/1990 | Doddrell et al. | 324/309 |

OTHER PUBLICATIONS

"Nuclear Magnetic Resonance and Its Applications to Living Systems", D. G. Gadian, 1982, Oxford University Press, New York (1982), pp. 131-132.

Primary Examiner—Ruth S. Smith
Attorney, Agent, or Firm—Lawrence P. Zale; Marvin Snyder

[57] ABSTRACT

A method for providing information about the rate of a selected chemical reaction in each of at least one selected volume elements (voxels) in a sample includes the steps of: exciting a reaction-rate-dependent chemical-shift spectrum, by a selected stimulus (such as one of saturation-transfer and inversion-transfer RF signal pulses) to label the NMR signal of a first reaction constituent; spatially localizing the NMR response signal, provided by the excited resonance, to a selected voxel within the sample; and acquiring and processing the NMR response data from the localized voxel. The excitation, localization and data acquisition subsequences are repeated to generate data substantially proportional, or equal, to the reaction rate constants in the selected voxels, and in planes and/or volumes thereof.

23 Claims, 6 Drawing Sheets

Fig. 3a
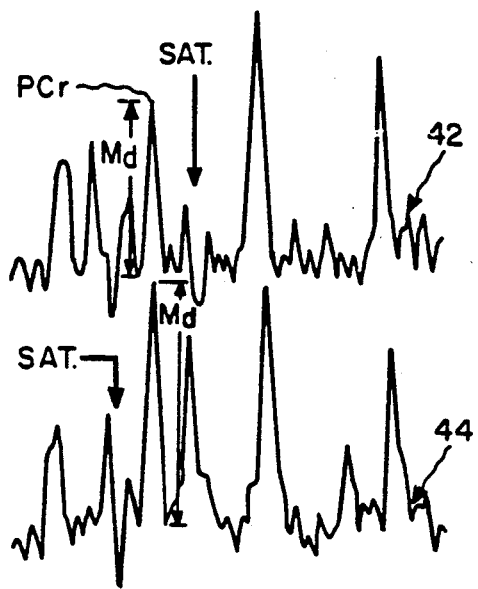
Fig. 3c
Fig. 3b
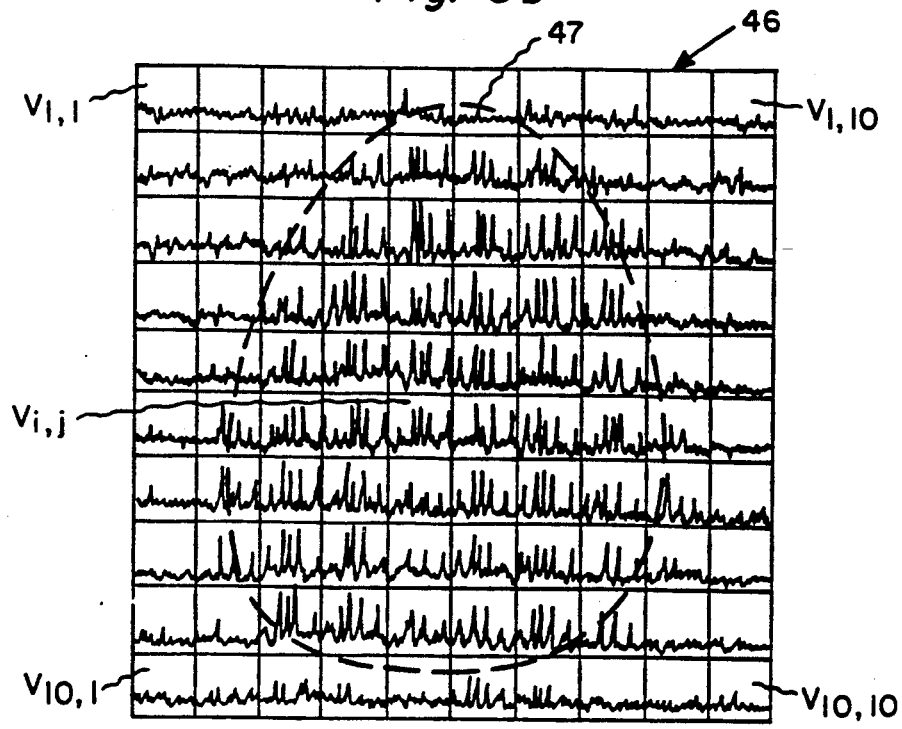

SPATIALLY-LOCALIZED CHEMICAL-REACTION-RATE NMR SPECTROSCOPIC IMAGING

This application is a continuation of application Ser. No. 07/727,334, filed Jul. 3, 1991 now abandoned, which is a continuation of application Ser. No. 07/392,316 filed Aug. 11, 1989, now abandoned.

BACKGROUND OF THE INVENTION

The present invention relates to nuclear magnetic resonance (NMR) imaging and spectroscopy and, more particularly, to novel methods for providing NMR images containing spatially-localized information about chemical reaction, or metabolic turnover rates between selected chemical species.

Hitherto, positron emission tomography (PET) was virtually unique in providing information about metabolic turnover, or chemical-species reaction rates, useable in medical diagnosis of human beings. However, because the PET image intensity is derived directly from substances which must be introduced into the human body via the bloodstream, the metabolic information for a region of tissue of interest is obscured by the amount of blood flow, the vascularization and even the number of tissue cells present in that tissue region. It is desirable to provide a non-invasive procedure. Further, because PET requires the use of a cyclotron, the cost of each PET metabolic imaging procedure is much more expensive than the cost of a typical NMR imaging procedure; consequently, PET useage is presently reserved for research, rather than everyday routine clinical, diagnostic use. It is highly desirable to provide a procedure in which the chemical reaction rate of a selected chemical species can be measured in each of a plurality of spatially-localized volume elements (voxels), and in which the resulting chemical reaction rate information can be made available for display and analysis. It is known, as described in "Nuclear Magnetic Resonance and its Applications to Living Systems", David G. Gadian, Clarendon Press, Oxford (1982), that saturation-transfer and inversion-transfer NMR spectroscopy techniques can be utilized for measuring whole-sample chemical reaction rates or metabolic turnover rates. However, there has hitherto been no method for obtaining a suitable NMR signal which is substantially proportional to the chemical reaction rate in a localized volume of a heterogeneous sample, to allow noninvasive measurement of metabolic turnover in normal and diseased tissue in voxels of living human beings, while directly observing naturally-abundant metabolites involved in human biochemical reactions, without obscuration of the voxel reaction rate information by flow, vascularization or cell density.

BRIEF SUMMARY OF THE INVENTION

In accordance with the invention, a method for providing information about the rate of a selected chemical reaction in each of a plurality of volume elements in a sample, comprises the steps of: exciting a reaction-rate-dependent chemical-shift spectrum, by a selected stimulus (such as one of saturation-transfer and inversion-transfer RF signal pulses) for labelling by NMR means of a first reaction constituent; localizing the NMR response signal, provided by the excited resonance, to a selected voxel (or plurality of voxels) within the sample; and acquiring the NMR response data from the localized voxel(s). When NMR response signals are acquired from one voxel at a time, the excitation, localization and data acquisition subsequences may be repeated to acquire data from other voxels within the volume to be investigated in the sample.

In presently preferred embodiments, carried out in NMR imaging systems having a static magnetic field in the range from about 1.5 Tesla (T) to about 4 T, reaction rates of a chosen reaction, e.g. the creatine-kinase reaction, are observed by measurement of spectra of a common element, e.g. $^{31}P$ spectra, sequentially with saturation/inversion RF pulses at NMR frequencies offsets above and below a selected resonance, to obtain a desired rate information. For example, +2.7 ppm (control), relative to phosphocreatine (PCr), are selected to obtain information about the rate of PCr reaction into adenosine triphosphate (ATP) from irradiation of the resonance of the $\gamma$-phosphate of ATP (or the $\gamma$-ATP nucleus). Any one of a large number of NMR localization subsequences can be used. Superpositioning of the spectra and/or of calculated metabolic turnover rate information on single voxels or on voxel image arrays are disclosed.

Accordingly, it is one object of the present invention to provide novel methods for reaction-rate-dependent chemical-shift spectral imaging in each of at least one voxel of a sample.

This and other objects of the present invention will become apparent upon reading the following detailed description, when considered in conjunction with the associated drawings.

BRIEF DESCRIPTION OF THE DRAWINGS

FIG. 3a is the chemical-shift spectra obtained from one voxel in the brain with respective desired-offset and reverse-offset (control) suppressant irradiation;

FIG. 3b is a IxJ voxel array display of reverse-offset metabolic spectra from a reaction-rate imaging sequence, superimposed over the outline of the sample being analyzed;

FIG. 3c is a similar IxJ voxel array display of calculated numbers proportional to the $PC_r$ metabolic reaction rate in each voxel, based upon the responses from FIG. 3b;

DETAILED DESCRIPTION OF THE PREFERRED EMBODIMENT

Figure 1:
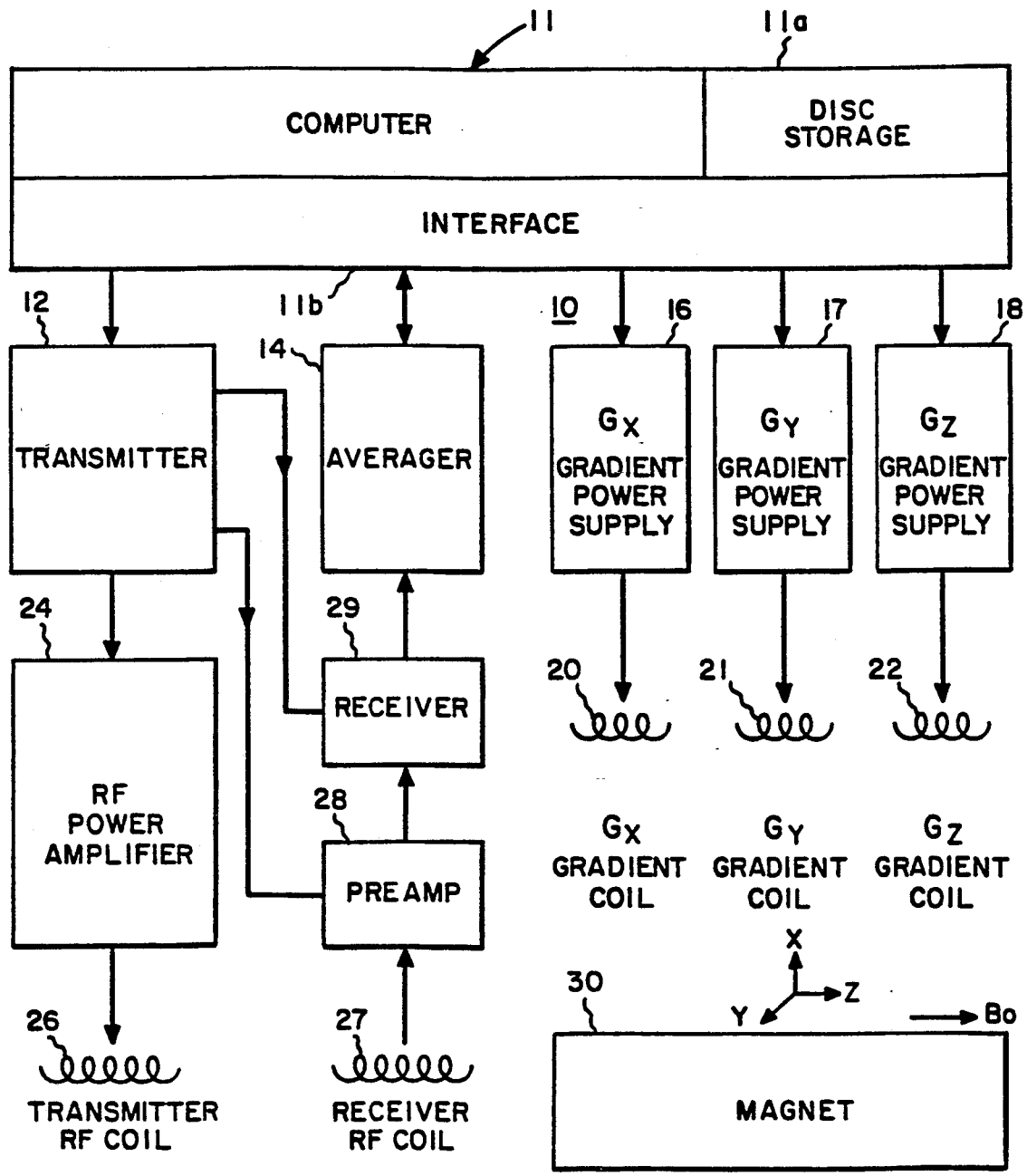
FIG. 1 is a block diagram of a NMR imaging system suitable for use with the method of the present invention.

FIG. 1 is a simplified block diagram of the major components of an NMR imaging system suitable for use with the NMR pulse sequences of the invention described herein. The system 10 is made up of a general purpose mini-computer 11 which is functionally coupled to a disk storage unit 11a and an interface unit 11b. An RF transmitter 12, signal averager 14, and gradient power supplies 16, 17 and 18 for respectively energizing X, Y and Z gradient coils 20, 21 and 22, are all coupled to computer 11 through interface unit 11b.

RF transmitter 12 is gated with pulse envelopes from computer 11 to generate RF pulses having the required modulation to excite nuclear resonance in the object under study. The RF pulses are amplified in RF power amplifier 24 to levels varying from several watts to several kilowatts, depending on the imaging method, and applied to transmitter coil 26. The higher power levels are necessary for large sample volumes, such as in whole body imaging, and where short duration pulses are required to excite large NMR frequency bandwidths.

The NMR signal is sensed by receiver coil 27, amplified in a low noise preamplifier 28 and applied for further amplification, detection, and filtering to receiver 29. The signal is then digitized for averaging by signal averager 14 and for processing by computer 11. Preamplifier 28 and receiver 29 are protected from the RF pulses during transmission by active gating or by passive filtering.

Computer 11 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are beyond the scope of the present invention). A function averaging the NMR response signals received by receiver means 29 may also be performed.

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the coils generate magnetic fields that are orthogonal to the direction of a static magnetic field $B_o$ produced by a magnet means 30. The coils may be isolated from the remainder of the system by enclosure in an RF shielded cage.

Magnetic field gradient coils 20, 21 and 22 are necessary to provide gradients $G_x$, $G_y$, and $G_z$, respectively. In the imaging pulse sequences described herein, the gradients should be monotonic and linear over the sample volume. Multivalued gradient fields cause a degradation in the NMR signal data, known as aliasing, which leads to severe image artifacts. Nonlinear gradients may cause geometric distortions in the image, or is the shape of the voxels.

In accordance with the invention, metabolic reaction rate imaging is performed by selecting a suitable reaction (i.e. a reaction with at least one resonance capable of resolution on the basis of chemical shift, and with a spin-lattice relaxation rate $(1/T_1)$, for at least the resonance of interest, which is not significantly greater than the desired reaction rate (k) and then subjecting a sample sequentially to: a first subsequence of NMR excitation signal pulses, to label reaction-rate-sensitive phenomena by NMR means, e.g. to excite a reaction-rate-dependent chemical-shift spectrum from the sample with suppression of signal from one exchange reactant; a second subsequence of NMR excitation signal pulses, to spatially localize the reaction-rate-sensitive phenomena to one or more volume elements (voxels); and a third subsequence of NMR signals to acquire a NMR response signal from the localized voxel(s). After a NMR response signal is stimulated in, and acquired from, each desired voxel in the sample, the stored response signals are processed to obtain rate-sensitive data for display.

Figure 2A:
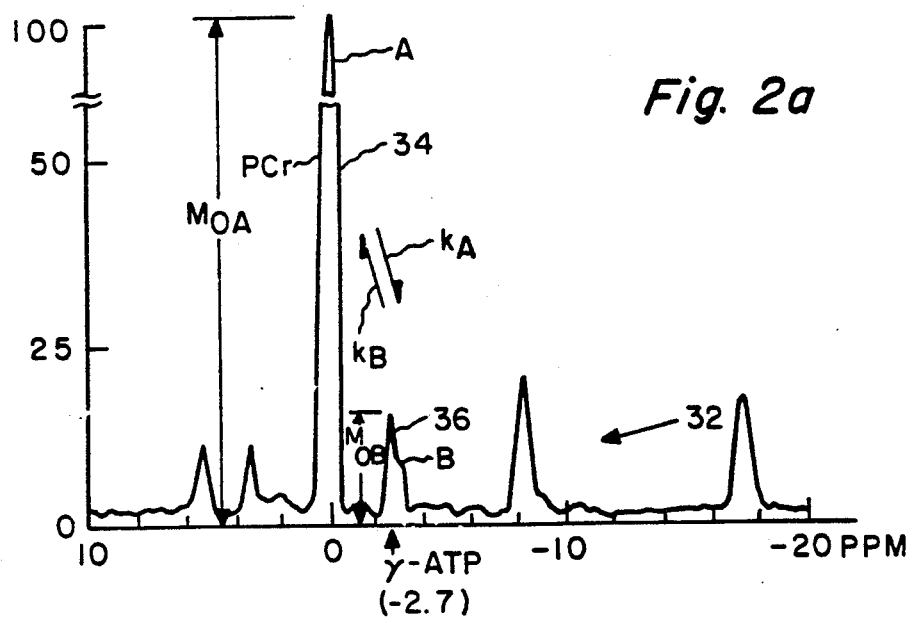
FIGS. 2a-2c are chemical-shift spectra of one metabolic reaction, respectively illustrating the normal spectrum, the desired-offset saturation spectrum and the reverse-offset saturation spectrum from a single localized voxel in human leg muscle.

Referring now to FIG. 2a, it is well known that a chemical-shift spectrum can be conventionally obtained from the constituents A and B of a metabolic reaction of the form

but information as to the magnitude of each of the forward reaction rate $k_A$ and the reverse reaction rate $k_B$ will not usually be present. For example, the creatine-kinase reaction (in which ADP is adenosine diphosphate)

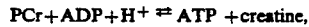

may be monitored, and a $^{31}P$ chemical-shift spectrum 32 obtained therefrom will show the phosphocreatine PCr peak 34 (here, normalized to 100% of full scale amplitude) and, amongst other peaks, the $\gamma$-ATP peak 36, which is of interest, as the $\gamma$-phosphorus atom in ATP is known to be involved in the reaction into PCr.

Figure 2B:
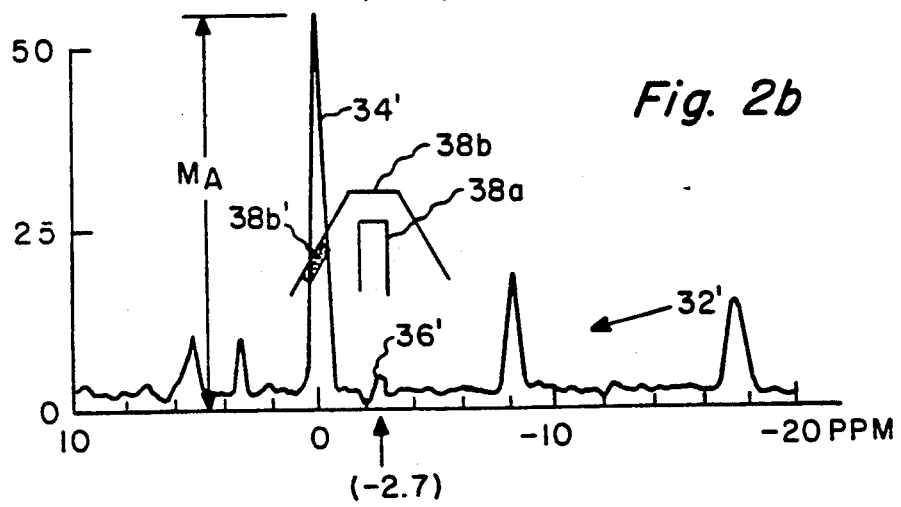

It is known that, in a two-constituent reaction $A \rightleftharpoons B$, if the equilibrium values of $M_{0A}$ (the magnetization of component A) and $M_{0B}$ (the magnetization of component B) are considered in the presence of an enzyme-catalyzed exchange reaction, then a NMR reaction-rate measurement procedure, performed with a NMR irradiation signal which suppresses, inverts or otherwise labels the resonance magnetization, i.e. makes invisible the activity, of one constituent in a reaction in which that constituent is altered to another constituent (e.g. with either a chemically-selective NMR saturation pulse or a chemically-selective NMR inversion pulse, directed at one of the A or B constituent resonances of interest) will cause the resonance magnetization of the other, non-irradiated constituent B or A, respectively, to be attenuated or altered to some new intensity $M_B$ or $M_A$, responsive to the "turnover" reaction rate $k_A$ or $k_B$, respectively. Thus, if the B constituent resonance is irradiated, the component B atoms arriving at constituent A with reaction rate $k_B$ will either contribute no signal to constituent A (if constituent B is irradiated to saturation) or will contribute a negative signal which is subtracted from the constituent A signal (if the constituent B is subjected to an inversion pulse). The signal from resonance A is then attenuated, as molecules of reactant A are converted to reactant B, with a reaction rate $k_A$. In either case, the loss in signal from the A constituent resonance causes the new A magnetization magnitude $M_A$, when compared with the amplitude $M_{0A}$ of the constituent A signal which is acquired from the same volume without inversion or saturation, to be proportional to the reaction rate $k_A$ (the rate at which A constituent atoms leave the A resonance). Thus, as seen in FIG. 2b, by irradiating one resonance (say, the second, B or γ-ATP resonance) such that its peak 36' is suppressed to a maximal extent, any signal contribution therefrom to the other reactant (e.g. the first, A or PCr resonance) peak is removed. Therefore, the amplitude of the peak of the reactant (here, PCr) whose rate is desired to be imaged is of reduced amplitude, as shown by lesser-amplitude signal 34', in the saturation-transfer (or inversion-transfer) spectrum 32'. The ratio of the amplitudes $M_{0A}$ and $M_A$ of signals 34 and 34', acquired from the same localized volume with and without chemically-selective irradiation, provides a useful measure of the chemical turnover rate $k_A$ of the desired constituent A (here, PCr). Similarly, a measure of the metabolic turnover rate $k_B$ from the second constituent B (here, γ-ATP) to the first constituent A (here, PCr) can be obtained by a localization procedure which utilizes a chemically-selective RF irradiation suppression signal tuned to the RF frequency of the first constituent A resonance, yielding a new intensity $M_B$ for the magnetization of the second constituent B; the ratio of the original amplitude $M_{0B}$ and the suppressed amplitude $M_B$ of the B resonances in the same localized volume, before and after radiation, is proportional to the reverse transfer constant $k_B$.

The differences in intensity of either reactant signal, due to chemically-selective irradiation, also depends upon the $T_1$ relaxation times of the species involved in the reaction, since the relaxation time measures the species "memory" of the irradiation event. Thus, in a given localized volume, for the saturation-transfer irradiation of the second (B) reactant for obtaining the forward transfer rate $k_A$, with the ratio of the first constituent magnetization $M_A$ with irradiation, to the magnetization $M_{0A}$ of the same constituent without irradiation, is given by $$k_A = (1 - R \cdot M_A / M_{0A}) / T'_{1A}$$

where $T'_{1A}$ is the $T_1$ relaxation time constant of the first reactant A resonance (measured in the presence of the saturating irradiation of the second reactant B resonance) and R is a saturation factor taking into account the fact that the NMR pulse sequences will typically be applied with a repetition time interval $T_R$ which will not permit full $T_1$ relaxation of the magnetization in reactant A, i.e. $T_R$ is comparable to $T'_{1A}$). Therefore, $$R = (1 - \exp(-T_R/T'_{1A}))/(1 - \exp(-T_R/T_{1A}))$$

where $T_{1A}$ is the $T_1$ relaxation time constant of the first constituent A resonance with the saturation or inversion irradiation turned off. It will be seen that the same results for the reverse transfer rate $k_B$ can be obtained by replacing all subscripts A with subscripts B, and vice versa; that is to say, the experiment for $k_B$ is performed by the irradiation of the A resonance and the measurement of the resulting second reactant B magnetization $M_B$.

The absolute values of the forward transfer rate $k_A$ and the reverse transfer rate $k_B$ can be calculated if the $T_1$ time constant of each of the involved species is measured using the same localization procedures. The $T'_{1A}$ or $T'_{1B}$ for each selected volume is measured by acquiring spectra using several different $T_R$ values with the saturating pulse applied to reactant B and A, respectively, Then the intensity M' for a resonance in a selected volume is calculated from $$M'_i = P + Q \exp(T_{Ri}/T'_1)$$

for the i-th $T_R$ value, where P and Q are curve-fitting constants and $T'_1$ is the desired value of $T'_{1A}$ or $T'_{1B}$. $T'_{1A}$ or $T'_{1B}$ is calculated by the same procedure, except that the data is acquired with the saturating pulse turned off. Alternatively, the $T_1$ ($T'_{1A}$, $T'_{1B}$, etc.) values can be measured by adding a non-selective inversion pulse at a time $T_I$ prior to a NMR excitation pulse in each NMR pulse sequence, and with the non-selective inversion pulses having different $T_I$ values so that, for each localized volume, and in a i-th excitation sequence, $$M_I = U(1 - V \exp(T_{Ii}/T_1))$$

where U and V are constants. The $T_1$ values for each localized volume are found and substituted into the above equation for the ratio $M_B/M_{0B}$ (and/or $M_A/M_{0A}$) and the equations are solved for the desired rate constant $k_A$ (and/or $k_B$) to extract the reaction rate of the first reactant A (and/or the second reactant B) in each selected volume element (voxel). To minimize computational and scanning time, it may be expedient to acquire the $T_1$ values with limited or no localization being utilized, so that spatially-averaged $T_1$ values are used.

In one presently preferred embodiment, inversion is utilized, rather than chemically-selective saturation, as use of an inversion signal causes actual subtraction of signal from the reacting species, whereas use of a saturation signal does not alter the reacting species signals. Therefore, inversion improves the dynamic range of the chemical "turnover" rate observation. However, inversion is much more sensitive to RF inhomogeneity than saturation. Accordingly, saturation is the preferred embodiment in situations where non-uniform excitation coils (such as surface coils and the like) are present, or when absolute measurement precision is required.

Figure 2C:
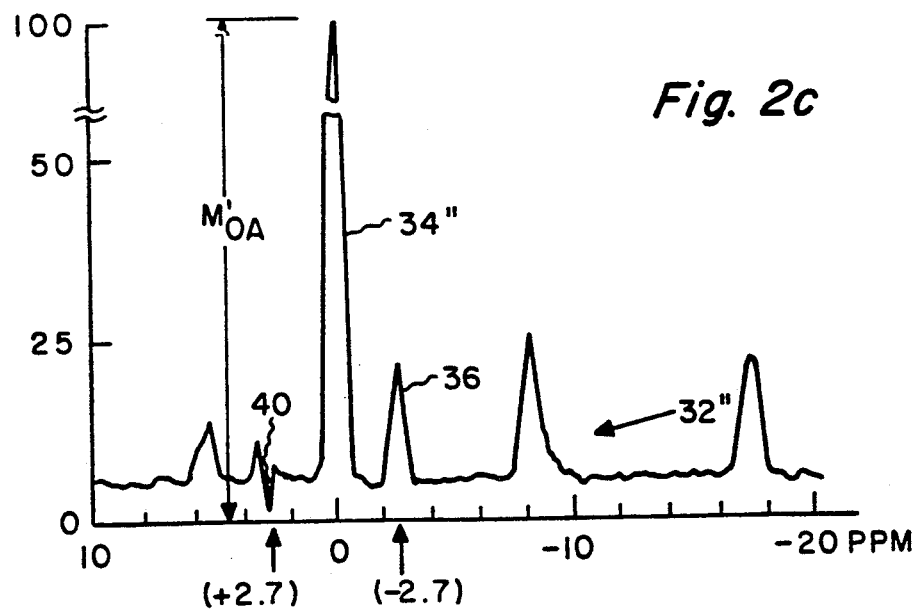

One additional problem concerns the bandwidth of the saturation or inversion RF pulse signal: ideally, the bandwidth will be as shown by bandwidth function 38a, and will have only enough frequency spread as to saturate or invert the resonance (here, the γ-ATP resonance) desired. However, an ideal, infinitely-steep-skirted bandwidth function is impossible to achieve in a real RF signal pulse of finite duration and any real saturation or inversion signal pulse will have a steep, but finite sloped, skirt of its frequency bandpass shape 38b. It will be seen that the accuracy of transfer rate measurement will depend upon what portion 38b', if any, of the saturation/inversion pulse bandpass has frequency components present within the spectral peak of the other reactant (here, PCr), which overlapping frequency component will undesirably change the amplitude of spectral peak 34'. As shown in FIG. 2c, the presence of an undesirably-wideband saturation/inversion pulse can be ascertained by using a complementary-frequency offset (i.e. changing the RF signal frequency so that the pulse appears on the opposite side of the desired constituent frequency) with offset reversed from the offset frequency of the desired constituent (here, the negative offset of γ-ATP, with respect to the "zero" frequency of the PCr peak) as a control. Thus, if the bandwidth of the saturation/inversion RF pulse is sufficiently narrow, when applied at frequency 40 upon the opposite side of the desired center spectral component A, a desired response pulse 34″ amplitude M′$_{0A}$ will be essentially equal to the amplitude M$_{0A}$ of the spectral response signal 34 acquired in the absence of saturation/inversion transfer from B, but experiencing the same amount of saturation from the saturation/inversion pulse, that would result from application of the saturation/inversion pulse to component B. An excessive bandwidth of the saturation/inversion pulse is thus manifest as a reduction in the amplitude M′$_{0A}$ of desired constituent peak 34″ below the magnitude M$_{0A}$ of peak 34. Accordingly, if the amplitude of the spectral component 34 of the constituent to be saturated/inverted is found to differ from peak 34″ where the saturation/inversion pulse is applied in the complementary location 40, the measured amplitude M′$_{0A}$ of reactant response spectral peak 34′ can be approximately used in the reaction rate calculations in place of M$_{0A}$.

Referring now to FIGS. 3a-3c, in accordance with aspects of the invention, an image containing information about the rate k$_A$ of a particular preselected chemical reaction is obtained in noninvasive manner by: (1) labelling (as by saturating or inverting) transfer of magnetization from a second reacting nuclear species to the magnetization of a first reactant nuclear species in the sample; and (2) then exciting and acquiring a NMR signal response from a localized voxel in the sample; (2) storing data concerning the magnitude of the magnetization peak of the desired first species; and repeating steps (1) through (3) with a complementary-offset, or no, suppression subsequence; before (4) processing a ratio of the desired peak amplitudes of the response spectral data to obtain the reaction rate constant. A NMR sequence with a saturation/inversion suppression subsequence produces a chemical-shift spectrum 42 as shown in the upper portion of FIG. 3a. Another chemical-shift spectrum 44, shown in the lower portion of FIG. 3a, is produced utilizing a similar NMR sequence, either devoid of the saturation/inversion signal or, as illustrated, with the saturation (or inversion) signal at a complementary frequency (e.g. a frequency displaced in the opposite direction, but with the same frequency offset, from the center frequency of the desired species). Here, the complementary offset frequency is a positive frequency offset, as the inverse of the negative frequency offset for the saturation signal shown in spectrum 42, relative to the central PCr frequency. Alternatively, the second spectrum 44 can be obtained from an excitation sequence totally devoid of a saturation/inversion pulse if the value of M$_{0d}$ is unchanged when the saturation/inversion pulse in spectrum 44 is turned off. In either case, with the second excitation sequence being either devoid of the saturation/inversion pulse or having a complementary-frequency saturation/inversion pulse, the amplitude of the peak attributable to the desired constituent is the original constituent magnetization M$_{0d}$, where d is the designator for the desired constituent, and the amplitude of the same constituent peak in the spectrum 42, produced responsive to a saturation/inversion pulse-containing excitation, is the modified desired-constituent magnetization M$_d$. Either chemical-shift spectrum 42 or 44 can be displayed, on a voxel-by-voxel basis, as a spectral array 46 as shown in FIG. 3b, with or without a superimposed outline 47 of the sample being studied (here, an axially-scanned human head). It will be understood that outline 47 can be obtained by other, known means, such as standard $^1$H NMR imaging and the like. Thus, the chemical-shift spectrum in each voxel V$_{i,j}$ (where i and j are the row and column designators for a rectangular pixel array) is displayed; here, each voxel is in a plane to be studied, e.g., a 100-voxel array with $1 \leq i \leq 10$ and $1 \leq j \leq 10$. Advantageously, as shown in FIG. 3c, the value of the desired reaction rate constant is calculated for each voxel and those voxels having a substantially non-zero reaction rate are provided with reaction rate information in an array display 48. It should be understood that the reaction rate information need not be displayed as numerical data, and can be displayed in ranged-form as color-coded or black-and-white pixels or contours and the like, as desired for any selected form of interpretation.

Figure 5A:
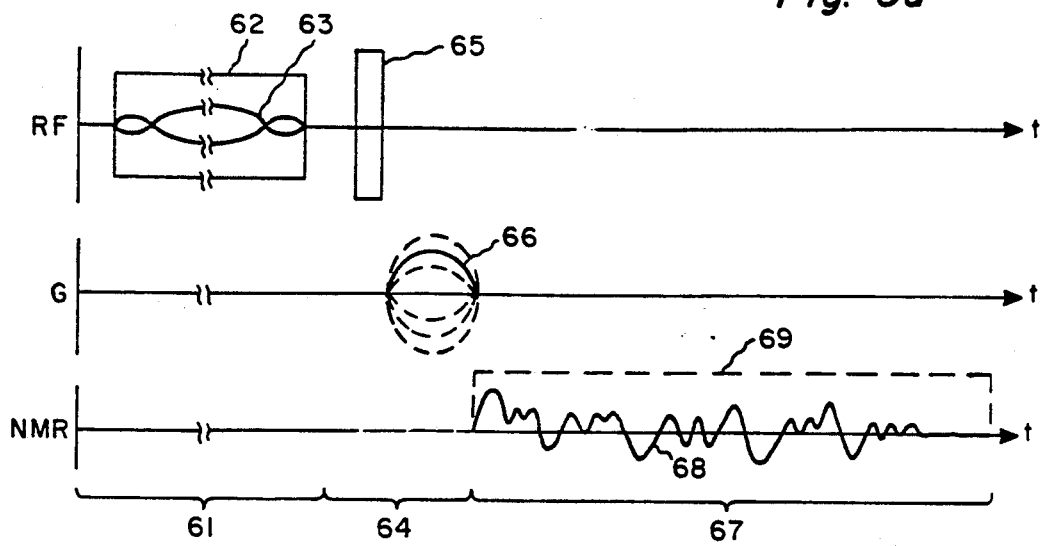
FIGS. 5a and 5b are timing diagrams of sets of RF and gradient magnet field excitation and NMR response signals for several different multiple-voxel or spectroscopic imaging sequences, each having a phase-encoding localization subsequence.
Figure 5B:
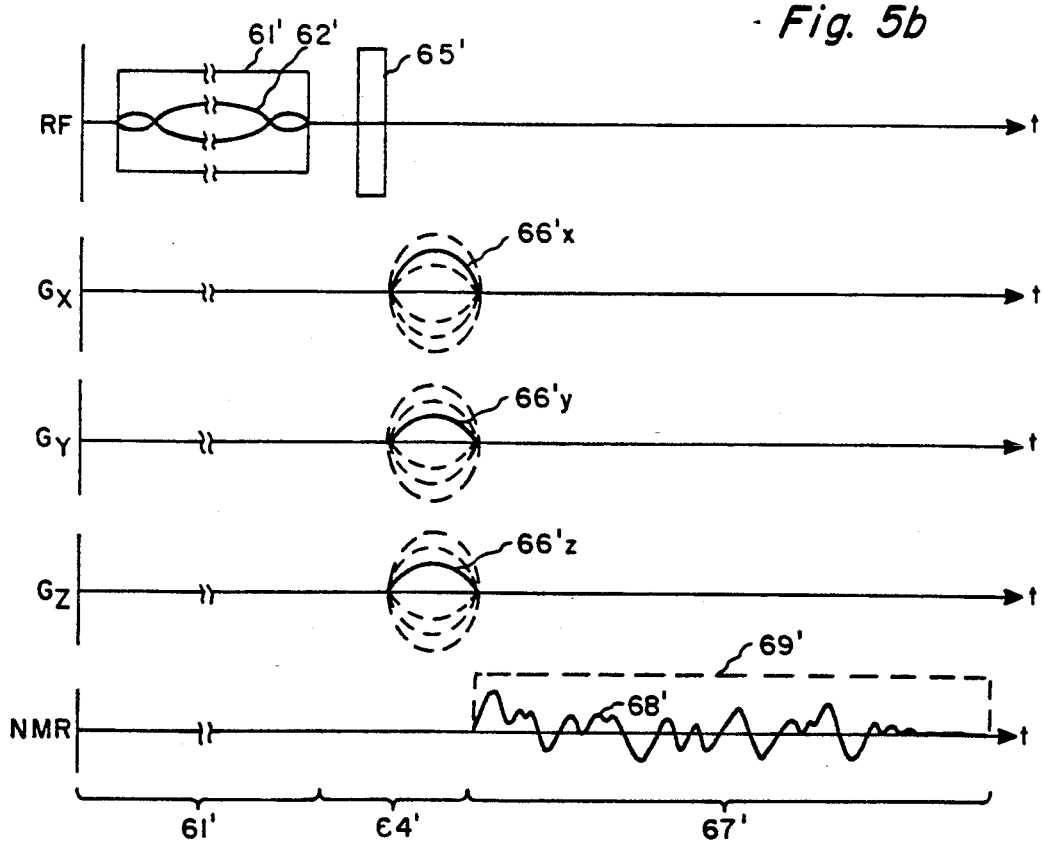
Figure 6A:
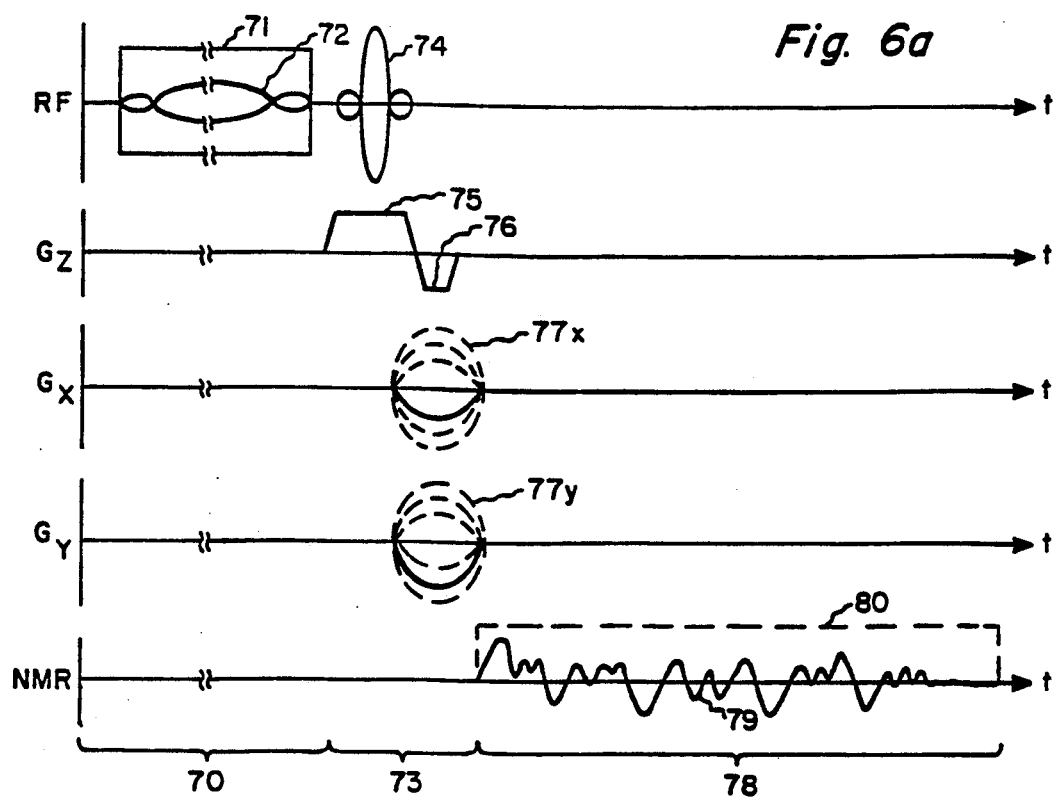
FIGS. 6a-6b are timing diagrams of sets of RF and gradient magnet field excitation and NMR response signals for several different multivoxel spectroscopic imaging sequences, each having a localization subsequence which includes a combination of slice-selecting and phase-encoding signals.
Figure 6B:
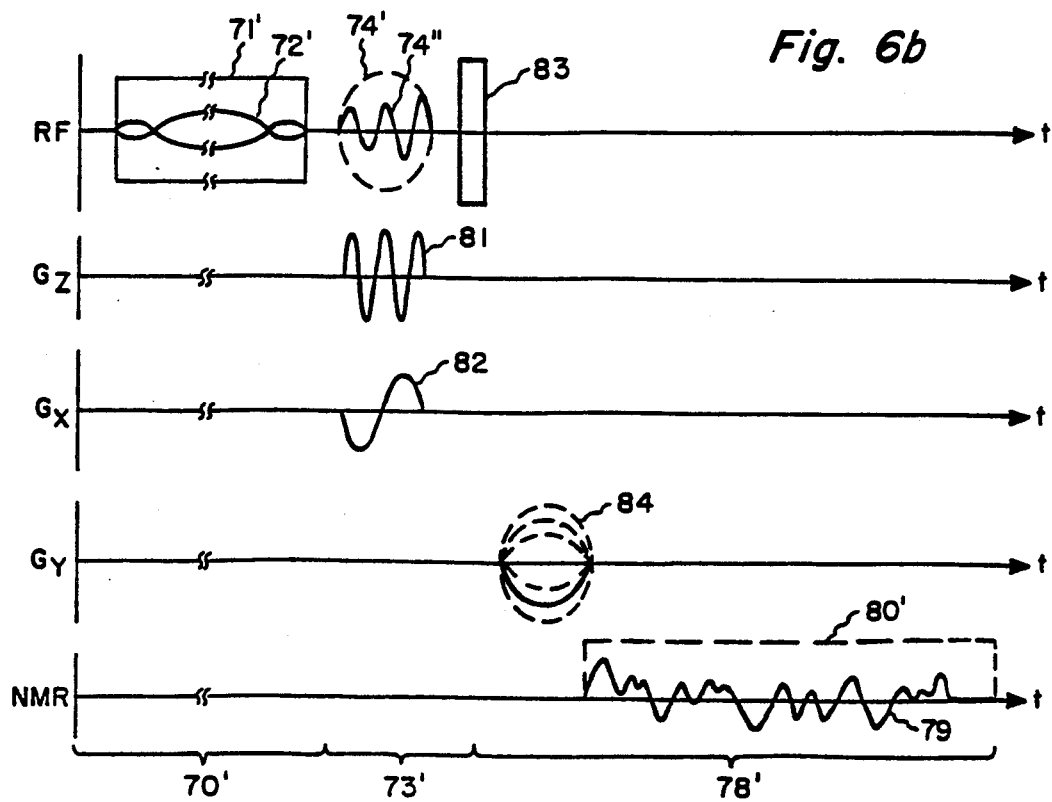

The method of the present invention thus utilizes chemical-shift spectrum data acquired with NMR sequences beginning with a reaction-rate (or k) "labelling"-irradiation (e.g. saturation or inversion) subsequence, followed by a spatial-localization subsequence and terminating with a data-acquisition subsequence, for each voxel of a plurality of volume elements in the sample. Many forms of localization and/or data acquisition subsequences can be used. As illustrative, but not exhaustive, examples, sequences with slice-selective localization subsequences are shown in FIGS. 4a-4c; the sequences with phase-encoded localization subsequences are shown in FIGS. 5a and 5b; and sequences with mixed localization subsequences are shown in FIGS. 6a-6c.

Figure 4A:
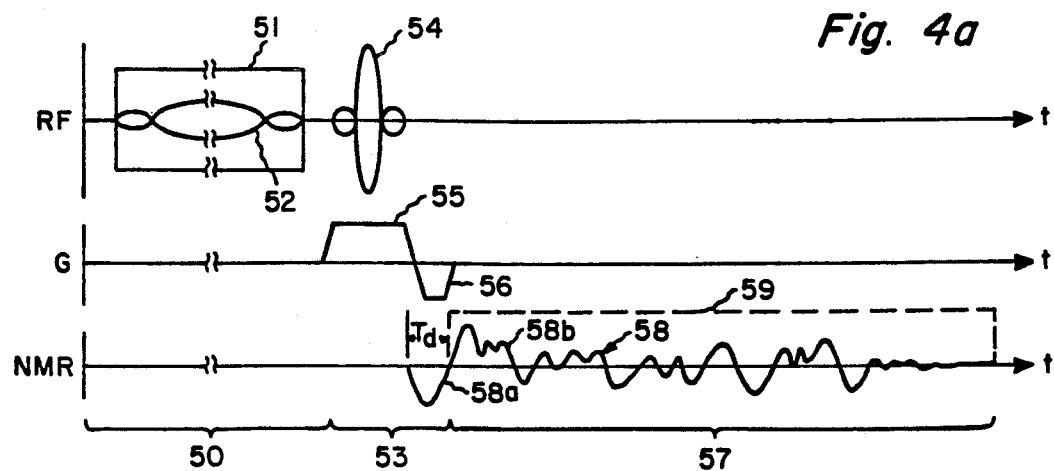
FIGS. 4a-4c are timing diagrams of sets of RF and gradient magnet field excitation and NMR response signals for several different single-voxel localization sequences, each having a slice-selective localization subsequence.

In FIG. 4a, the steps of k-labelling irradiation, localization and chemical-shift spectral acquisition are combined in a single NMR sequence starting with an saturation/inversion subsequence 50 having either (1) a chemically-selective saturation pulse 51, of sufficiently long duration to form a monochromatic NMR RF signal pulse of a frequency (e.g. −2.7 ppm from the desired PCr resonance frequency) tuned to excite and saturate the NMR signal in a single chemical species (e.g. γ-ATP) in the NMR spectrum, or (2) a chemically-selective inversion pulse 52, which is an extended duration monochromatic NMR RF pulse (typically with an amplitude-modulated envelope, which selectively inverts only those nuclei of a single chemical species (e.g. γ-ATP) in the involved reaction. In the localization subsequence 53, at least one slice-selective signal is provided by a combination of an amplitude-modulated (e.g with a sinX/X envelope) RF signal pulse 54 being applied in the presence of a magnetic field gradient G pulse 55 to spatially select NMR signals in a preselected plane, perpendicular to the gradient direction, in the sample. RF signal pulse 54 corresponds to a flip angle $a \leq 90°$. A negative-polarity gradient refocussing lobe 56 is utilized. In the data acquisition subsequence 57, the initial portion 58a of the NMR response signal, during an acquisition delay time interval T$_d$, is ignored, and only a latter portion 58b of the response signal is accepted by receiver means 29, responsive to the presence of a data gate signal 59.

Figure 4B:
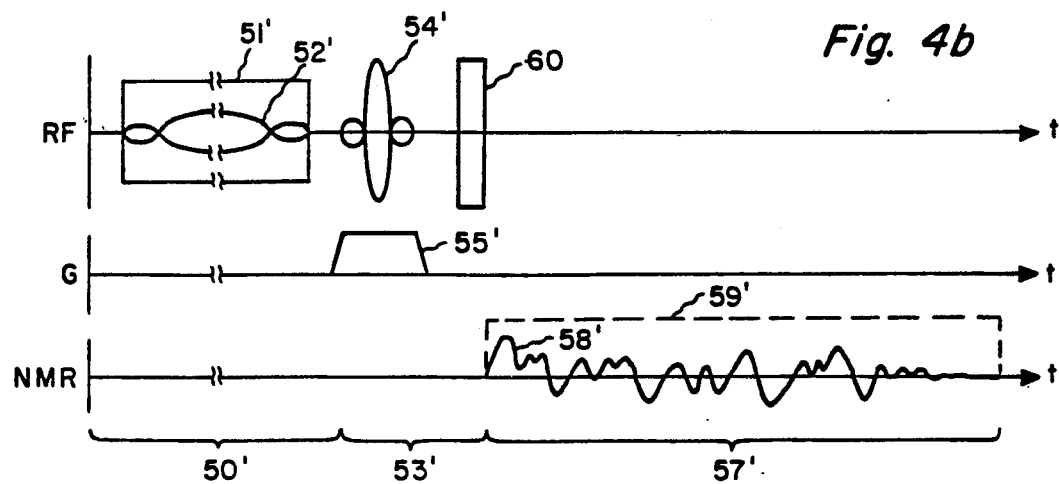

In FIG. 4b, the localized volume is again a plane, but is now selected by a spatially selective-inversion pulse, comprising the RF pulse 54′ and its associated gradient G pulse 55′, in the localization subsequence 53′. Signal readout is responsive to a conventional non-selective RF pulse 60, of flip angle on the order of 90°, and no data acquisition time delay is required. Therefore, the data gate signal 59′ begins at the termination of the non-selective RF pulse 60, and substantially all of the response signal 58′ is utilized. This form of plane-selective sequence requires that the spectrum from each voxel be computed as the difference in two successive NMR response signals, with the second signal being the result of utilization of a sequence devoid of the selective/inversion signal pulse subsequence 54', and subsequences 53' and 57' otherwise unchanged.

Figure 4C:
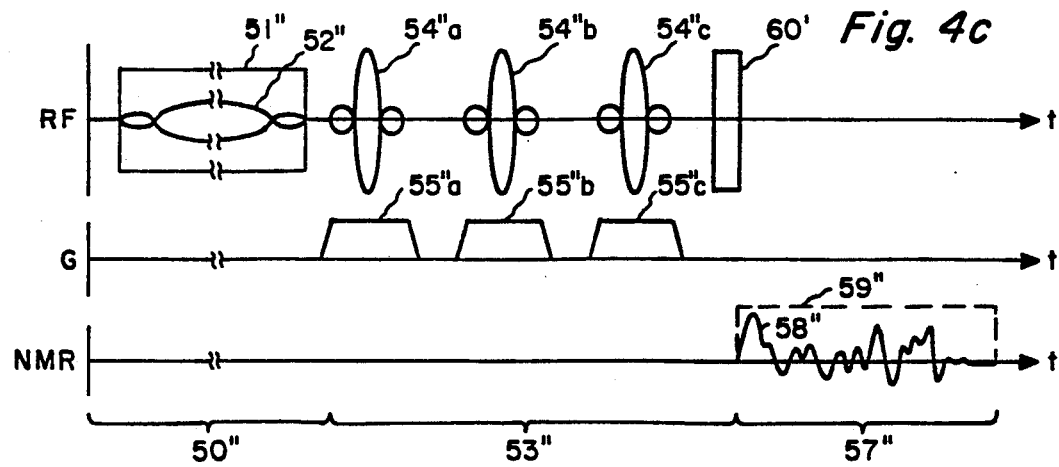

FIG. 4c illustrates one NMR slice-selective sequence in which the localized volume is resolved in all three dimensions of a Cartesian coordinate system, by utilizing a selective inversion pulse in each of the three coordinate systems directions. Thus, the sequence begins with a reaction-rate-labelling saturation or inversion subsequence 50", having a respective RF saturation pulse 51" or an inversion RF pulse 52". The following localization subsequence 53" includes three consecutive slice-localization pulses; a first pulse for localization includes in a first direction, e.g. the X direction, including RF pulse 54"a and associated gradient pulse 55"a; a second pulse, comprising a second RF pulse 54"b and an associated gradient pulse 55"b, for localization in a second direction, (here, along the Y axis); and a third pulse, comprising a RF signal pulse 54"c and an associated gradient pulse 55"c, for localization in the remaining orthogonal direction (here, the Z direction). The data acquisition subsequence 57" begins with a nonselective readout pulse 60' and the entire NMR response signal 58" is acquired, responsive to the presence of a data gate signal 59". It will be understood that, in order to obtain the required NMR signals from the entire 3D-resolved volume, this sequence must be repeated at least eight times, with all combinations of the selective-inversion pulses in subsequence 53" being applied and removed, and with resultant NMR signals being properly added and subtracted in accordance with the known ISIS method.

Referring now to FIGS. 5a and 5b, spatial localization can be performed with phase-encoding gradients. A planar-localized sequence (FIG. 5a) commences with a reaction-rate-labelling saturation/inversion subsequence 61, containing a RF saturation pulse 62 or a RF inversion pulse 63. The subsequent localization subsequence 64 utilizes a non-selective excitation pulse 65, with a flip angle not exceeding 90°, and a subsequent phase-encoding gradient G lobe 66, having a particular amplitude selected out of the multiplicity of amplitudes necessary for encoding multiple localized volumes which have to be resolved in a single dimension i.e. the direction of the gradient G then being applied. The subsequent data acquisition subsequence 67 captures substantially all of the NMR response signal 68, responsive to the presence of data acquisition gate signal 69. The sequence of FIG. 5a is repeated at least N times, with N different intensities of the gradient G pulse 66, to resolve spectra from N different spatial locations. The chemical-shift-spectra are available following two-dimensional (2D) Fourier transformation (FT) of the NMR signals, with respect to gradient amplitude and time.

In FIG. 5b, a fully 3D-resolved, gradient-encoded spatial localization sequence is shown, for resolving the multiple localized volumes in all three dimensions, by requiring repetition of the sequence a total of $N_xN_yN_z$ times, with $N_x$ different amplitudes of the $G_x$ gradient pulse 66'x, $N_y$ different amplitudes of the $G_y$ gradient pulse 66'y and $N_z$ different amplitudes of the $G_z$ gradient pulse 66'z, all in the localization subsequence 64'. The remaining portions of the localization subsequence, as well as the saturation/inversion subsequence 61' and data acquisition subsequence 67', are similar to the corresponding portions of the sequence of FIG. 5a. In the 3D-resolved method, the spectra are obtained by 4DFT of the NMR signals, with respect to all three gradient directions (X, Y and Z) and time.

Referring now to FIG. 6a, the slice-selective gradient and phase-encoding gradient spatial selection methods can be combined so that, after the chemical-species-selection subsequence 70, utilizing either a chemically-selective saturation pulse 71 or a chemically-selective inversion pulse 72, the localization subsequence 73 contains slice-selective signals (RF pulse 74 and gradient pulses 75 and 76) for resolving to a plane perpendicular to a first gradient direction (here, the Z direction, as set by use of a $G_z$ gradient) and phase-encoding gradients for resolving in the two remaining directions, of a Cartesian coordinate system. Thus, the RF pulse 74 and simultaneous gradient pulse 75 resolves the sample into a plane of voxels perpendicular to the gradient direction (here, the Z direction) in which the gradient pulse 75 occurs. Subsequently, a gradient refocussing pulse 76 is provided, substantially cotemporally with phase-encoding gradient pulses 77x and 77y, resolving the resulting Z-axis-parallel plane to a single X-Y voxel therein. The NMR signal 79, evoked from that one voxel, is received responsive to the data acquisition gate signal 80 in the acquisition subsequence 78. It will be appreciated that the sequence must be repeated $N_xN_y$ times, with $N_x$ different $G_x$ gradient amplitudes and $N_y$ different gradient $G_y$ amplitudes, and that a 3DFT must be performed, with respect to gradient amplitude and time, to obtain spectra from each 3D-localized volume. It will also be appreciated that this method can be extended to acquire spectra from a multiplicity M of planes, by interleaving the location of the one-dimensional selectively-excited plane in the same number M of selective applications of the sequence, applied at intervals of about $T_R/M$, within the normal repetition period $T_R$ of the pulse sequence.

Referring now to FIG. 6b, a combination of two slice-selective gradients and one phase-encoding gradients are utilized in a pulse sequence where multiple localized volumes are resolved along one dimension (here the Y axis) of a volume selectively inverted in the other two dimensions with a two-dimensional spatially-selective inversion pulse. Thus, after the initial chemical-species-selection subsequence 70' (containing either a chemically-selective saturation pulse 71' or a chemically-selective inversion pulse 72'), the localization subsequence 73' includes a selectively-inverting, two-dimensional spatially-selective pulse comprising a RF pulse 74' and a gradient rotating in two dimensions, here in the X-Z plane, as caused by the $G_Z$ gradient pulse 81 and the $G_X$ gradient pulse 82. Thereafter, a phase-encoding gradient pulse 84, in the remaining direction (here, the Y direction) is applied, after the non-selected excitation pulse 83 ends. The evoked NMR signal 79 is received and digitized, responsive to data acquisition pulse 80', in the ensuing data acquisition subsequence 78. It will recognized that for each phase-encoding gradient value $N_y$, the sequence must be repeated at least twice, with and without the two-dimensional spatially-selective pulse (as may be provided by the presence and absence of the RF pulse 74') and the resulting NMR signals subtracted to obtain a two-dimensionally-resolved volume which is to be phase-encoded. The one-dimensionally-resolved spectra will be obtained by 2DFT of the difference NMR signal, with respect to the amplitude of the phase-encoded gradient (here, $G_Y$) and time. It will also be understood that the RF pulse may be modified to provide a pulse 74" which causes a two-dimensional excitation pulse, instead of a two-dimensional inversion pulse, in which case the non-selective excitation pulse 83 may be omitted. In this case, the sequence need not be applied twice for each phase-encoding value.

It will be understood that all of the above exemplary sequences can also be utilized in other manners; for example, a spin-echo pulse sequence can be created from each by adding a substantially-180° NMR pulse after the last excitation pulse in each localization subsequence and postponing data acquisition of the NMR signal until after the cessation of the substantially-180° RF pulse.

While several presently preferred embodiments of our novel invention have been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A method for providing information about a rate of a selected chemical reaction in each of at least one selected voxel of a sample, comprising the steps of:
   (a) immersing the sample having at least a first reaction constituent and a second reaction constituent in a static magnetic field;
   (b) labeling the second reaction constituent by applying a chemically-selective RF stimulus to the sample in the absence of a magnetic field gradient, said labeling including the step of substantially inverting resonance magnetization from the second reaction constituent, the chemically-selective RF stimulus being an RF pulse having a frequency substantially centered at a selected characteristic peak of an NMR chemical shift spectrum of the second reaction constituent, and having a bandwidth substantially the width of the selected characteristic peak;
   (c) exciting an NMR response signal from the first constituent resonance, and spacially localizing the NMR response signal to a desired one of the at least one selected voxel;
   (d) acquiring and storing data characterizing a magnetization amplitude $M_A$ of the NMR response signal from the desired voxel;
   (e) substantially inverting a complementary control portion of the NMR spectrum of the second reaction constituent, with respect to the resonance of the second reaction constituent, and
   (f) repeating the steps (c) and (d), for the same desired voxel, to obtain data characterizing an inverted magnetization amplitude $M'_{0A}$; and
   (g) calculating from the $M_A$ and $M'_{0A}$ data a quantity substantially proportionate to a reaction rate constant $k_A$ in that desired voxel.

2. The method of claim 1 wherein the step of labeling the second reaction constituent comprises the step of applying an RF pulse having a frequency and bandwidth that substantially avoids inversion of major peaks of the NMR spectrum of the first reaction constituent.

3. A method for providing information about a rate of a selected chemical reaction in each of at least one selected voxel of a sample, comprising the steps of:
   (a) immersing the sample having at least a first reaction constituent and a second reaction constituent in a static magnetic field;
   (b) labeling the second reaction constituent by applying a chemically-selective RF stimulus to the sample in the absence of a magnetic field gradient, said labeling including the step of substantially saturating a resonance of the second reaction constituent, the chemically-selective RF stimulus being an RF pulse having a frequency substantially centered at a selected characteristic peak of an NMR chemical shift spectrum of the second reaction constituent, and having a bandwidth substantially the width of the selected characteristic peak;
   (c) exciting an NMR response signal from the first reaction constituent resonance, and spacially localizing the NMR response signal to a desired one of the at least one selected voxel;
   (d) acquiring and storing data characterizing a magnetization amplitude $M_A$ of the NMR response signal from the desired voxel;
   (e) substantially saturating the resonance of the second reaction constituent with an RF stimulus having a frequency matching a complementary control portion of the NMR spectrum of the second reaction constituent, and
   (f) repeating the steps (c) and (d), for the same desired voxel, to obtain data characterizing an saturation magnetization amplitude $M'_{0A}$; and
   (g) calculating from the $M_A$ and $M'_{0A}$ data a quantity substantially proportionate to a reaction rate constant $k_A$ in that desired voxel.

4. The method of claim 3 wherein the step of labeling the second reaction constituent comprises the step of applying an RF pulse having a frequency and bandwidth that substantially avoids saturation of major peaks of the NMR spectrum of the first reaction constituent.

5. The method of claim 3, further comprising the step of repeating steps (b)–(g) for at least one other voxel in the sample.

6. The method of claim 5, further comprising the step of providing data for a plurality of voxels all located in a single plane of the sample.

7. The method of claim 5, further comprising the step of providing data for a plurality of voxels all located in a selected volume of the sample.

8. The method of claim 3, further comprising the steps of: acquiring an image of the sample having a plurality of voxels; and superimposing upon each voxel of the sample image a selected one of the an intensity representing reaction rate constant $k_A$ for that voxel.

9. The method of claim 3, wherein the sample is a portion of a living organism, and the selected chemical reaction is a metabolic reaction.

10. The method of claim 9, wherein the metabolic reaction is a creatine-kinase reaction.

11. The method of claim 3, wherein the reaction-rate $k_A$ constant is calculated from $k_A = (1 - R \cdot M_A/M_{0A})/T'_{1A}$ where R is a factor accounting for the use of a NMR repetition time interval $T_R$ which will not permit full $T_1$ relaxation of the magnetization of reactant A, and $T'_{1A}$ is the $T_1$ relaxation time constant of the reactant A in the presence of irradiation of readout B.

12. The method of claim 11, wherein a value of $T'_{1A}$ is measured in each voxel.

13. The method of claim 11, wherein a spatially-averaged average value of $T'_{1A}$ is used.

14. The method for providing information about a rate of a selected chemical reaction of claim 3 wherein step (c) comprises the step of applying at least one spatially selected RF stimulus with an NMR flip-angle of less than or substantially comparable to 90° applied in the presence of a first magnetic field gradient pulse, followed by a second gradient pulse having polarity opposite that of the first magnetic field gradient pulse.

15. The method for providing information about a rate of a selected chemical reaction of claim 3 wherein step (c) comprises the step of applying at least one spatially RF inversion pulse applied in the presence of a magnetic field gradient pulse followed by a substantially non-selective RF stimulus having an NMR flip-angle of less than or substantially comparable to 90°.

16. The method of claim 3 wherein step (c) comprises the steps of:
   (c1) applying an RF stimulus to the sample to excite an NMR response signal from at least the first reaction constituent in the sample; and
   (c2) applying a phase-encoding magnetic field gradient pulse in at least one spatial dimension in order to spatially localize the NMR response signal from at least the first reaction constituent to at least one desired voxel.

17. The method for providing information about a rate of a selected chemical reaction of claim 16 wherein step (c1) comprises the step of applying an RF stimulus having an amplitude and duration chosen to produce an NMR flip-angle of less than or substantially comparable to 90°.

18. The method for providing information about a rate of a selected chemical reaction of claim 16 wherein step (c2) comprises the step of applying three phase-encoding magnetic gradients pulses in three substantially orthogonal spatial dimensions.

19. The method of claim 3 wherein step (c) comprises the steps of:
   (c1) applying a spatially selective RF stimulus to the sample to excite an NMR response signal from at least the first reaction constituent localized in at least one spatial dimension in the sample; and
   (c2) applying a phase-encoding magnetic field gradient pulse in at least a second spatial dimension in order to spatially localize the NMR response signal from at least the first reaction constituent to at least one desired voxel.

20. The method for providing information about a rate of a selected chemical reaction of claim 19 wherein the step (c1) comprises the step of applying a time-changing, at least two-dimensional spatially selective pulse in the presence of a magnetic field gradient pulse to create a magnetic field gradient whose direction is reoriented in two spatial dimensions over time.

21. The method for providing information about a rate of a selected chemical reaction of claim 19 further comprising the step of applying a phase-encoding magnetic field gradient pulse in a third spatial dimension.

22. The method of providing information about a rate of a selected chemical reaction of claim 19 wherein step (c1) comprises the step of applying at least one spatially selective excitation pulse having an NMR flip-angle less than or substantially comparable to 90° in the presence of a magnetic field gradient pulse, followed by a gradient pulse of opposite polarity.

23. The method for providing information about a rate of a selected chemical reaction of claim 19 wherein step (b) comprises applying an RF stimulus having a sinc pulse shape having an amplitude defined by: $\sin(t)/t$ where t is time.

* * * * *